United States Patent
Bashir et al.

[11] Patent Number: 5,747,353
[45] Date of Patent: May 5, 1998

[54] METHOD OF MAKING SURFACE MICRO-MACHINED ACCELEROMETER USING SILICON-ON-INSULATOR TECHNOLOGY

[75] Inventors: Rashid Bashir, Santa Clara; Abul E. Kabir, Sunnyvale, both of Calif.

[73] Assignee: National Semiconductor Corporation, Santa Clara, Calif.

[21] Appl. No.: 814,352

[22] Filed: Mar. 11, 1997

Related U.S. Application Data

[62] Division of Ser. No. 633,197, Apr. 16, 1996, abandoned.

[51] Int. Cl.$^6$ .................................................. H01L 21/265
[52] U.S. Cl. .......................... 437/21; 437/51; 437/60; 437/974; 437/901; 148/DIG. 135
[58] Field of Search .......................... 437/51, 60, 974, 437/901, 21, 921; 148/DIG. 135

[56] References Cited

U.S. PATENT DOCUMENTS

| | | | |
|---|---|---|---|
| 5,155,061 | 10/1992 | O'connor et al. | 437/974 |
| 5,345,824 | 9/1994 | Sherman et al. | 73/517 R |
| 5,369,544 | 11/1994 | Mastrangelo | 361/283.4 |
| 5,413,955 | 5/1995 | Lee et al. | 437/901 |
| 5,417,111 | 5/1995 | Sherman et al. | 73/517 R |
| 5,447,067 | 9/1995 | Biebl et al. | 73/514.32 |
| 5,461,916 | 10/1995 | Fujii et al. | 73/514.32 |
| 5,490,034 | 2/1996 | Zavracky et al. | 361/283.4 |
| 5,495,761 | 3/1996 | Diem et al. | 73/514.32 |
| 5,576,250 | 11/1996 | Diem et al. | 437/901 |

OTHER PUBLICATIONS

Howe, Roger T. et al, "Silicon micromechanics: sensors and actuators on a chip", IEEE Spectrum Jul. 1990, pp. 29–35.
Bryzek, J. et al. "Micromachines on the March," IEEE Spectrum, May 1984, pp. 20–31.

Primary Examiner—Tuan H. Nguyen
Attorney, Agent, or Firm—Limbach & Limbach L.L.P.

[57] ABSTRACT

A method of making a surface micro-machined accelerometer using a silicon-on-insulator (SOI) wafer structure. Both the acceleration (or deceleration) sensor and associated signal conditioning circuitry are monolithically fabricated on the same substrate. The top silicon layer of the SOI wafer is used as the sensing member, corresponding to the movable, common electrode of a differential capacitor pair. The components of the signal conditioning circuitry are fabricated in the SOI layer using standard SOI processing techniques. Because the top silicon layer is single crystal silicon, it does not suffer from the stress related warping common with polysilicon members. In addition, because the method described is compatible with bipolar, BiCMOS, or CMOS process flows, it may be used to fabricate faster and lower noise level signal conditioning circuitry than can be obtained using current techniques for making monolithic accelerometers.

10 Claims, 10 Drawing Sheets

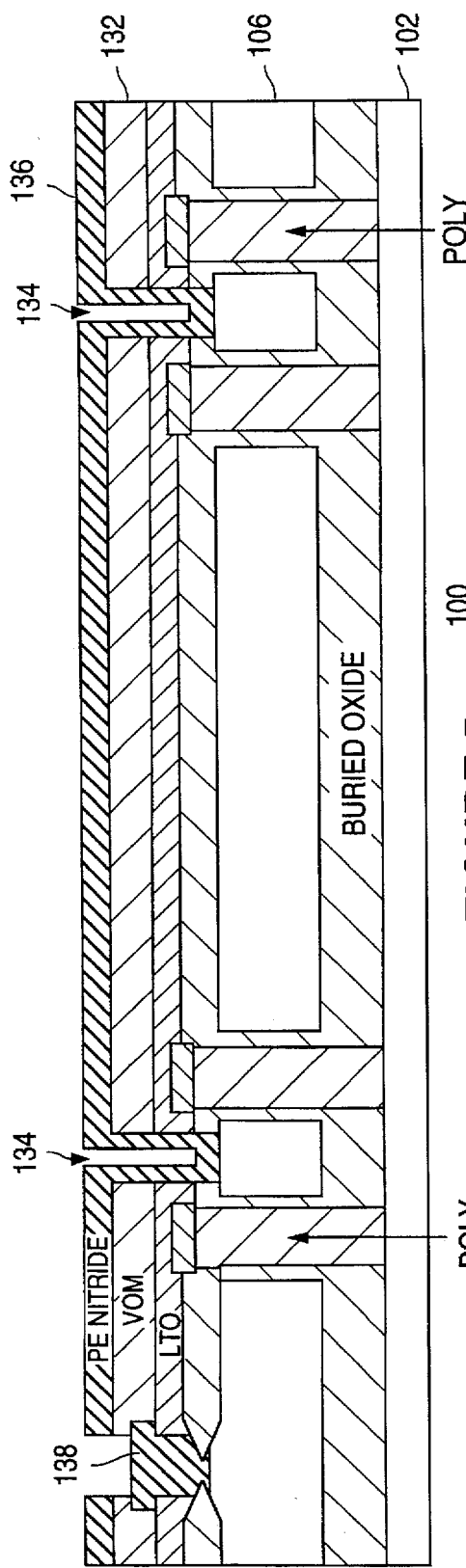
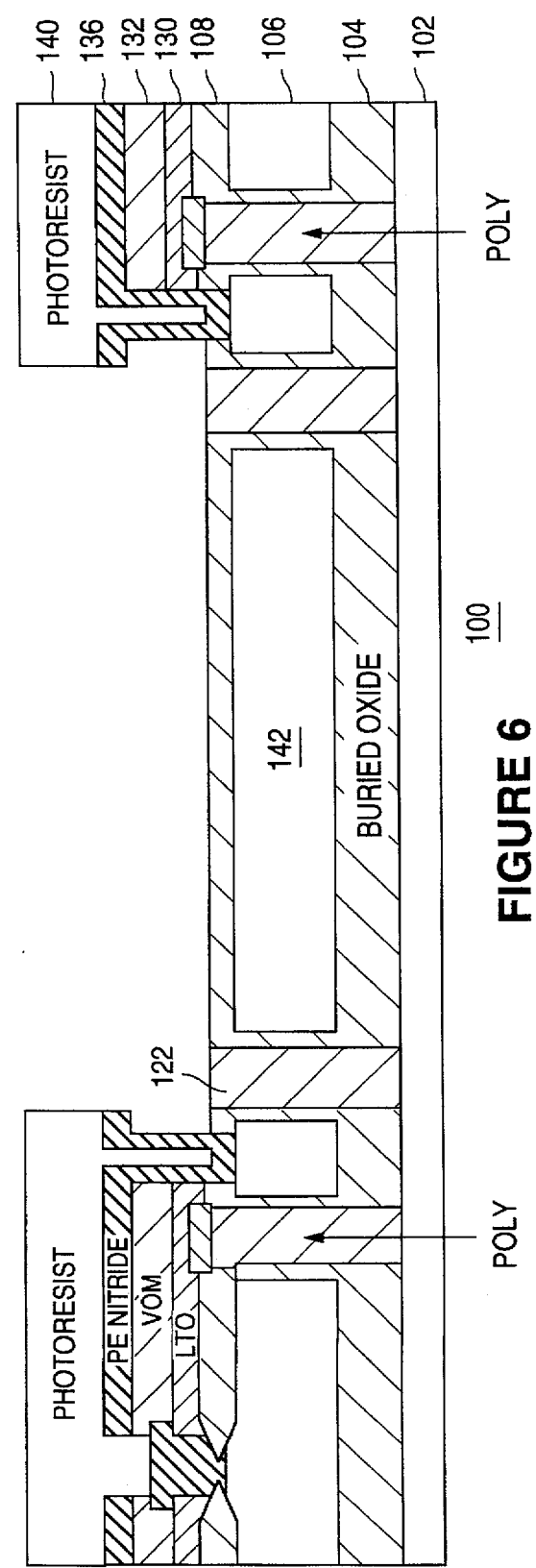
FIGURE 5
FIGURE 6

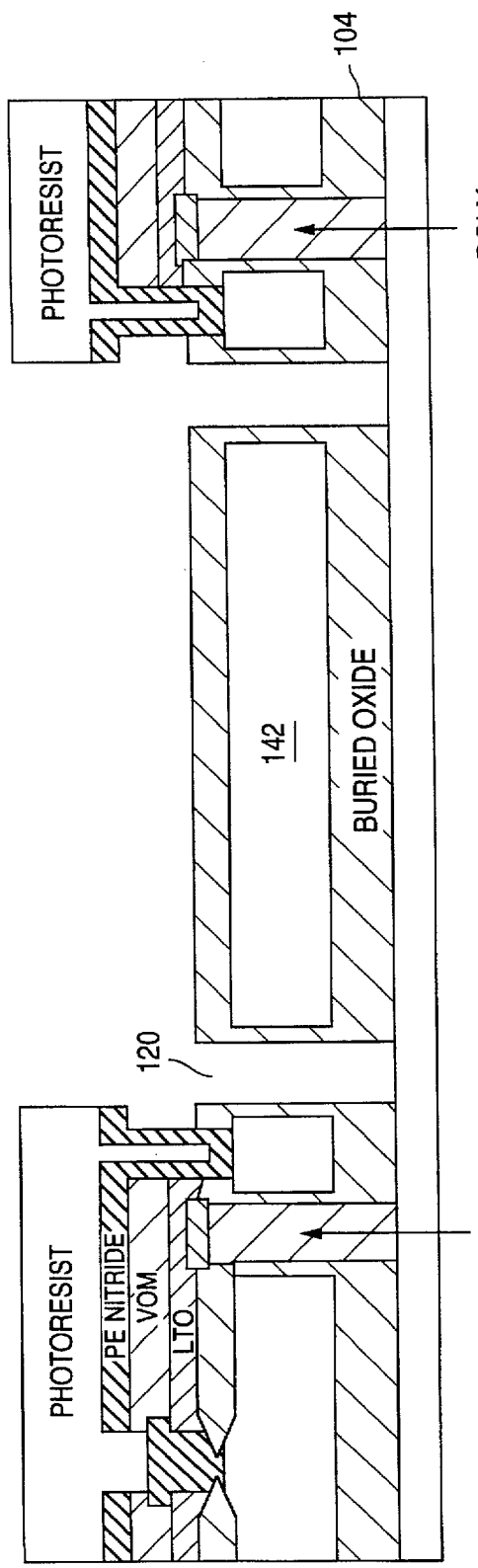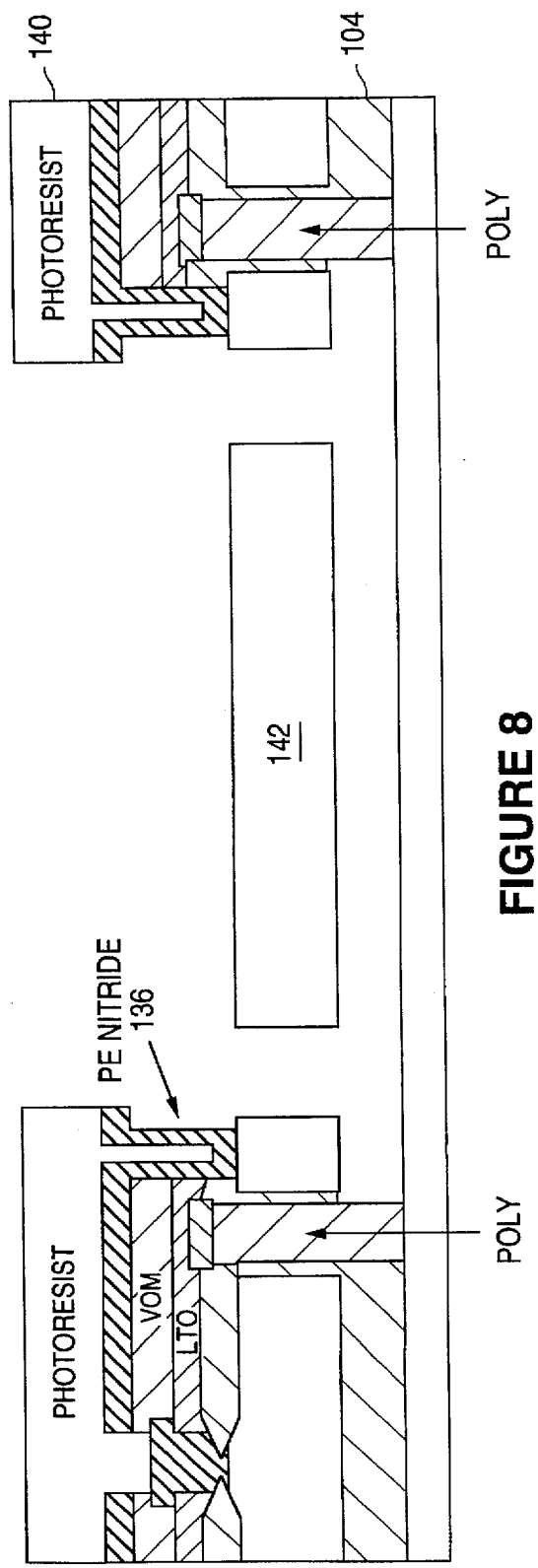

METHOD OF MAKING SURFACE MICRO-MACHINED ACCELEROMETER USING SILICON-ON-INSULATOR TECHNOLOGY

This is a divisional of application Ser. No. 08/633,197, filed Apr. 16, 1996, now abandoned.

TECHNICAL FIELD

The present invention relates to accelerometers used to measure the acceleration imparted to a body, and more specifically, to a method of making such sensors using silicon-on-insulator technology which is compatible with integrated circuit fabrication techniques. This permits the formation of a monolithic device which includes the sensor and the associated signal conditioning circuitry.

BACKGROUND OF THE INVENTION

Accelerometers are used to measure the magnitude of an acceleration (or deceleration) or to detect when an imparted acceleration reaches a threshold value. If the magnitude of an acceleration or deceleration is measured, it may be used to infer the magnitude of the applied force which produced the acceleration or deceleration, or if the force is known, to infer the mass of a body subjected to the acceleration or deceleration. If used to detect a threshold acceleration or deceleration value, the accelerometer may be used as part of a control system to actuate another device when the threshold value is reached.

An accelerometer is typically composed of two primary components: (1) an acceleration (deceleration) sensing element (transducer) ; and (2) associated signal conditioning circuits which are used to provide a useful output signal. As integrated circuit fabrication techniques have progressed, it has been found possible to manufacture a monolithic accelerometer in which both the acceleration sensor and the signal conditioning circuitry are contained on a single wafer.

U.S. Pat. No. 5,345,824, entitled "Monolithic Accelerometer", issued Sep. 13, 1994, describes a microfabricated acceleration sensor and monolithically fabricated signal conditioning circuitry. The sensor is based on a differential capacitor structure formed from two capacitors. Each capacitor has two electrodes, one of which (the common electrode) is movable and electrically connected between the capacitors. The remaining electrode of each capacitor is stationary. The electrodes are formed of polysilicon members which are suspended above a silicon substrate. When an acceleration or deceleration is applied to the substrate, the movable electrodes change their position relative to the stationary electrodes. This causes the capacitance of one of the capacitors of the differential pair to increase and the capacitance of the other capacitor to decrease. The differential capacitance change is then converted to a useful measure (the corresponding voltage) by signal conditioning circuitry. The converted signal is fedback to the system as a control signal to restore the position of the movable electrode.

U.S. Pat. No. 5,417,111, entitled "Monolithic Chip Containing Integrated Circuitry and Suspended Microstructure", issued May 23, 1995, describes a monolithically fabricated accelerometer comprising an acceleration sensor and associated signal conditioning circuitry. The circuitry includes bipolar and MOS circuit elements. As with the device described in U.S. Pat. No. 5,345,824, the sensor is based on a differential capacitor structure formed from two capacitors. The capacitor electrodes are again formed of polysilicon members which are suspended above a silicon substrate.

The acceleration sensors described in the noted patents are compatible with fabrication techniques used in the semiconductor industry. As a result, they can be made using the same processing techniques as are used for the associated signal conditioning circuitry. This is an advantage compared to situations where the sensor and associated circuitry require different processing methods. However, because the acceleration sensors are made from a polysilicon member, they have an inherent disadvantage. Polysilicon suffers from built-in stress which can cause the sensor to buckle or warp. This reduces the accuracy of the acceleration measurement, and can lead to a device failure. Polysilicon based sensors are also limited in sensitivity because the thickness of the polysilicon member (which determines the sensitivity of the sensor when it is used for sensing of lateral acceleration) is constrained by currently used processing techniques.

Another disadvantage of such monolithic devices is that the components of the signal conditioning circuitry are not as fast or as fully isolated as may be desired for some applications. This is because the manufacturing processes for the monolithic accelerometers described in the noted U.S. patents are only compatible with certain device fabrication processes. These processes may not be capable of producing circuit elements having a desired degree of isolation for the intended application.

What is desired is a method for manufacturing monolithic accelerometers which is compatible with integrated circuit processing techniques and produces a device which overcomes the disadvantages of devices produced using current methods.

SUMMARY OF THE INVENTION

The present invention is directed to a method of making a surface micro-machined accelerometer using a silicon-on-insulator (SOI) wafer structure which is compatible with integrated circuit fabrication techniques. Both the acceleration (or deceleration) sensor and the associated signal conditioning circuitry are monolithically fabricated on the same substrate. The top silicon layer of the SOI wafer is used to form the acceleration sensor and corresponds to the movable, common electrode of a differential capacitor pair. The components of the signal conditioning circuitry are fabricated in the SOI wafer using standard SOI processing techniques. Because the top silicon layer is single crystal silicon, it does not suffer from the stress related warping problem common to polysilicon members. In addition, because the method described is compatible with bipolar, BiCMOS, or CMOS process flows, it may be used to fabricate SOI-based faster and lower noise level signal conditioning circuitry than is produced using current techniques for making monolithic accelerometers.

Further objects and advantages of the present invention will become apparent from the following detailed description and accompanying drawings.

BRIEF DESCRIPTION OF THE DRAWINGS

FIGS. 1 through 9 are side cross-sectional views showing the process flow for fabricating the accelerometer of the present invention using silicon-on-insulator processing techniques known in the semiconductor industry.

DETAILED DESCRIPTION OF THE PREFERRED EMBODIMENT

Figure 1:
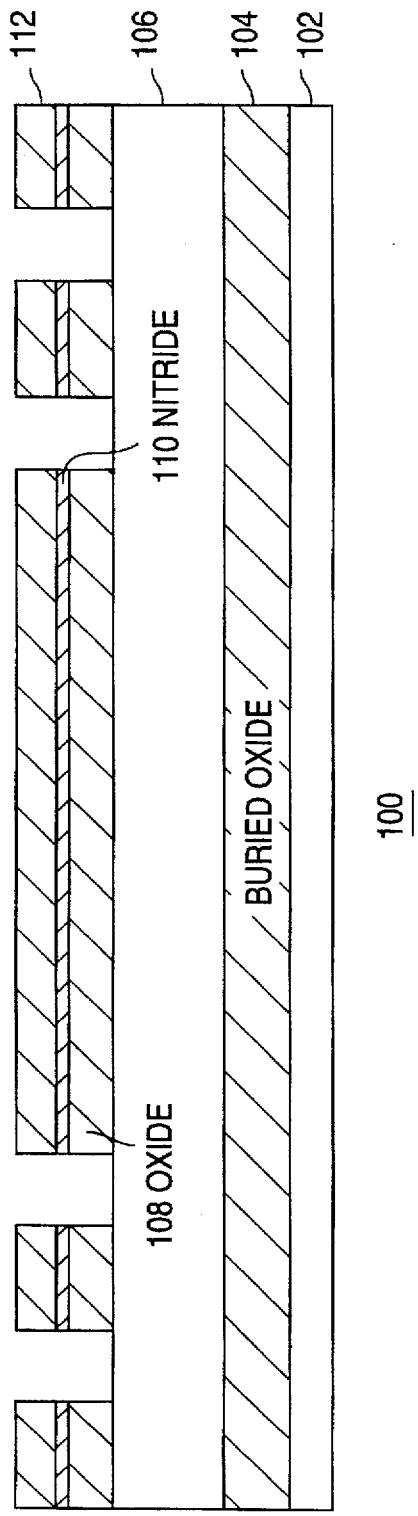

Silicon-on-insulator (SOI) structures are used in the semiconductor industry as a form of device isolation, and are based on surrounding an active device with an insulating layer. This isolation method is often used in circumstances where standard junction isolation methods (in which active regions are isolated by a junction at the bottom of the region within a silicon substrate) would not be effective. SOI technology provides isolation from the substrate or wafer and is used in conjunction with trenches or junctions (which provide side isolation) to provide full isolation.

There are several methods for forming SOI wafers presently being used in the semiconductor industry. One of these methods is termed "wafer bonding". In this method, two silicon wafers are used; a base wafer which remains intact and is used as the substrate, and a bonded wafer which is bonded to the base wafer and then thinned to provide a silicon layer in which active devices are fabricated. According to this method, the bonded wafer is typically oxidized to form a one micron thick silicon-dioxide ($SiO_2$) layer. The surface of the base wafer is then brought into contact with the silicon-dioxide layer under clean room conditions. The resulting composite wafer is annealed at a high temperature in a furnace to form the final bond. The bonded wafer is then thinned by surface grinding and polished by a chemical-mechanical polishing (CMP) technique to produce a silicon layer on top of a buried oxide layer, which in turn rests on a substrate.

Another method of forming SOI structures is known as the SIMOX, or separation by implanted oxygen method. In this method, oxygen is implanted at a high dose and energy into a silicon substrate. During the implant step the wafer is heated to ensure that the wafer surface maintains its crystallinity. A post-implant anneal step is then performed to produce an isolation region comprised of a buried layer of silicon-dioxide which lies in between a silicon layer and a substrate.

A third method of forming a SOI structure is the zone-melting recrystallization (ZMR) process. In this process, an active-device layer is formed by recrystallizing a polysilicon layer that has been deposited on a thermally oxidized silicon wafer. Typically, the substrate wafer is heated close to the melting point of silicon by a heating unit placed beneath the wafer, while a graphite heating strip or focused lamp provides the additional energy necessary to melt the polysilicon layer. As the secondary heating element is scanned over the polysilicon layer, a molten zone is formed. The grain size of the polysilicon is increased upon recrystallization of the molten zone, thereby forming a surface on which active devices may be fabricated.

SOI isolation methods combined with deep trench isolation offer many advantages over other standard isolation methods. The combination of SOI and trench isolation provides full dielectric isolation, resulting in reduced capacitive coupling between the circuit elements on a chip. SOI and trench isolation methods often lead to reduced chip size and/or increased device packing density because minimum device separation is dependent on the resolution limits of the photolithography processes used, rather than being determined by oxide encroachment or the non-planarity of an active region. Finally, because SOI and trench isolation methods cause reductions in parasitic capacitance and chip size, the speed of devices which utilize these isolation methods is increased compared to a situation in which the same device is fabricated using other isolation techniques.

FIGS. 1 through 9 are side cross-sectional views showing the process flow for fabricating the accelerometer of the present invention using silicon-on-insulator processing techniques known in the semiconductor industry. FIG. 1 shows the basic SOI wafer structure 100 used for fabricating the acceleration sensor and associated circuitry. The SOI wafer 100 is comprised of a silicon substrate 102 or base wafer, a buried oxide layer 104, and a top layer 106 of single crystal silicon. Buried oxide layer 104 is approximately 0.5 to 2 microns thick, and silicon layer 106 is approximately 2 to 25 microns thick. For the purposes of the present invention, SOI wafer 100 may be formed using any of the currently known methods, such as those previously described.

Photolithographic techniques are used to define the buried layers, wells, and sinker regions for the accelerometer sensor. These regions will be used for device formation for the signal conditioning circuitry and for electrical connection of the common electrodes of the capacitors which form the sensing element(s) of the accelerometer. As would be expected, the patterning of the top surface of SOI wafer 100 will depend upon the circuit design adopted for the signal conditioning circuitry. In order to prepare SOI wafer 100 for fabrication of the signal conditioning circuitry, an N-type buried layer is formed by implanting Antimony at a dose of 3 to $5 \times 10^{15}$ atoms/cm$^2$ and an energy of 80 to 100 KeV. A P-type buried layer is formed by implanting Boron at a dose of 1 to $2 \times 10^{15}$ atoms/cm$^2$ and an energy of 100 to 160 KeV. An N-type sinker region is formed by implanting Phosphorous at a dose of 5 to $8 \times 10^{15}$ atoms/cm$^2$ and an energy of 100 to 160 KeV. A P-type sinker region is formed by implanting Boron at a dose of 3 to $8 \times 10^{11}$ atoms/cm$^2$ and an energy of 20 to 50 KeV. Note that the dose, energy, and type of atoms implanted may be varied according to the design of the signal conditioning circuitry and the process flow used.

Preparation of SOI wafer 100 in this manner allows for later fabrication of the signal conditioning circuitry used for processing the output of the sensor. The signal conditioning circuitry may be fabricated using a process flow (e.g., bipolar, BiCMOS, or CMOS) which is compatible with that used for forming the sensor. The result is an SOI wafer compatible process flow which produces both an improved sensor element and signal conditioning circuitry having the benefits of SOI technology (increased speed, improved isolation, etc.). After formation of the buried layers, wells, and sinker regions, a layer of epitaxial silicon may be grown on top of the wafer. This will provide a thicker silicon layer 106 for the continued processing of the sensor element and associated circuitry.

As shown in FIG. 1, a layer of field oxide 108 is then grown on silicon layer 106. Oxide layer 108 is typically 0.2 to 1 micron thick. A layer of nitride 110 is deposited on top of oxide layer 108. Nitride layer 110 is typically 0.1 to 0.3 microns thick. A layer of low temperature oxide (LTO) 112 is then deposited on top of nitride layer 110. LTO layer 112 is typically 1 to 2 microns thick. A photoresist mask is used to define the regions of the structure which will be subjected to an etch process. A $CHF_3$ based chemistry reactive ion etch is then performed in a LAM 384T Triode etcher manufactured by Lam Research of Fremont, Calif. This etch removes the desired regions of LTO layer 112, nitride layer 110, and oxide layer 108, permitting further processing of the defined regions. The remaining portions of LTO layer 112 serve as a hard mask which defines the locations of the trenches which will be etched into SOI wafer 100.

Figure 2:
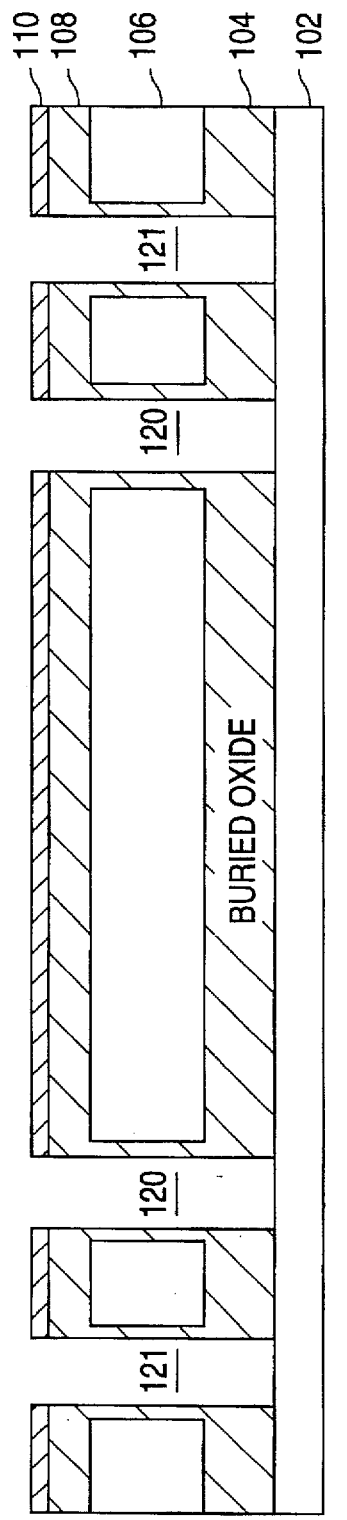

FIG. 2 shows SOI wafer structure 100 after the structure has been subjected to the processing steps used to etch trenches into the wafer. Sensor trenches 120 and anchor trenches 121 are etched in structure 100 in a two-step process. First, the trench locations are etched down to buried oxide layer 104 using an AMAT 5000 magnetically enhanced reactive ion etch (RIE) system and a HBr based chemistry. As noted, patterned LTO layer 112 (as shown in FIG. 1) serves as the etch mask during this step. Buried oxide layer 104 is then etched by a RIE etch process conducted in a LAM 384T Triode etcher using a $CHF_3$ based chemistry. The remaining portions of LTO layer 112 are then removed. The sidewalls of trenches 120 and 121 are then oxidized, producing a 500 to 3000 Å thick oxide layer (not shown) on the sidewalls and bottom of the trenches. Next, an anisotropic RIE etch process (based on a $CHF_3$ chemistry) is used to remove the portion of the oxide layer on the bottom of trenches 120 and 121. This is done so that the polysilicon which will be grown in the trenches in a later step can directly contact the substrate. The resulting structure is shown in FIG. 2.

Figure 3:
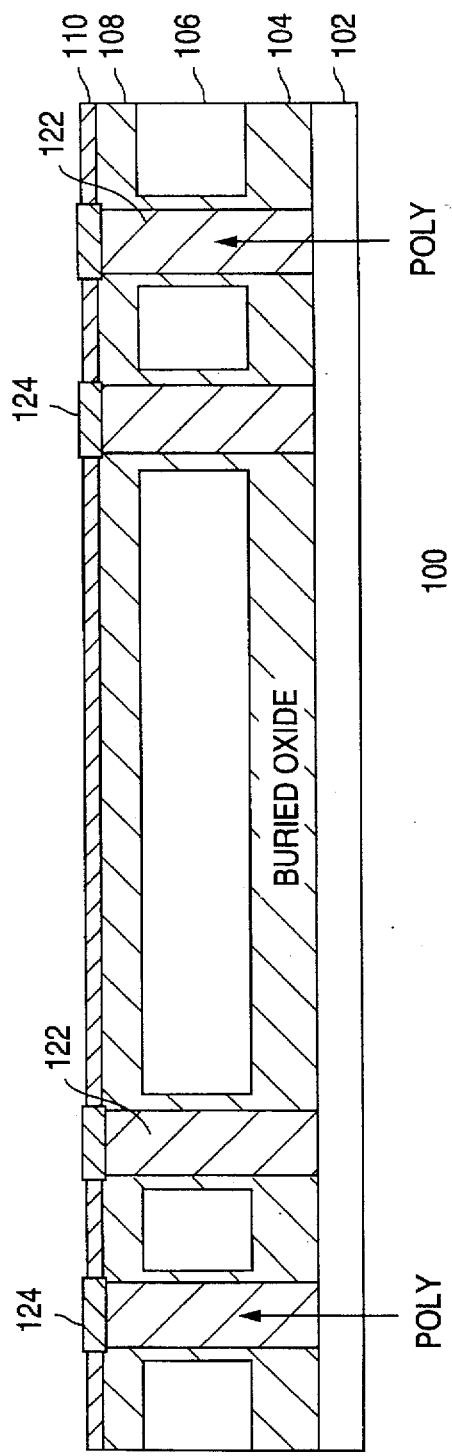

Next, trenches 120 and 121 are filled with polysilicon 122. A low temperature (600° to 625° C.), low stress polysilicon deposition process is used. The top of the polysilicon 122 filling trenches 120 and 121 is etched back over the top surface of SOI wafer 100, approximately level with nitride layer 110. The polysilicon caps on top of trenches 120 and 121 are then oxidized, producing a 2000 to 3000 Å thick layer 124 of oxide. The resulting structure is shown in FIG. 3.

The processing of SOI wafer 100 to form the signal conditioning circuitry is then performed. The circuit elements used for signal conditioning are fabricated according to a process flow which is compatible with use of an SOI wafer. As noted, bipolar, BiCMOS, or CMOS processes are compatible and may be used, depending upon the design and requirements of the signal conditioning circuitry. Typically the process flow would include implant and diffusion steps, the opening of contact regions, deposition of a metal layer, patterning of the metal layer to define the contacts, and removal of the remaining metal layer by means of a suitable etch process.

Fabricating the signal conditioning circuitry in an SOI wafer provides numerous advantages over other methods of forming the circuitry. SOI isolation is preferred for high voltage applications, or for use in high radiation level environments. SOI based fabrication sequences are often simpler than methods used to fabricated devices on bulk silicon. Furthermore, SOI isolation (when combined with trench isolation) results in reduced capacitive coupling between circuit elements, and in CMOS circuits, latchup is eliminated. SOI and trench isolation reduces chip size and/or increases packing density. SOI based devices have reduced parasitic capacitance, which combined with reduced chip size, leads to increased speed. Thus, one benefit of the present invention is that it enables production of an improved acceleration (or deceleration) sensor using a process flow which also results in circuitry having the advantages of SOI based devices.

Figure 4:
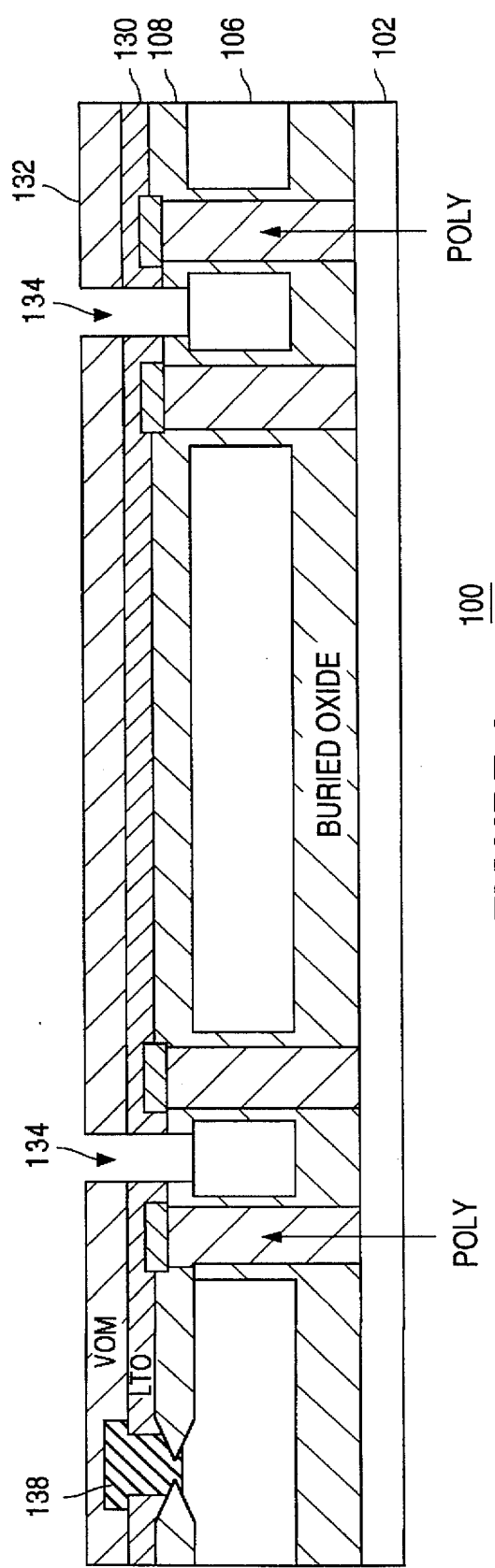

After fabrication of the signal conditioning circuitry, a layer of low temperature oxide (LTO) 130 is deposited over the top surface of SOI wafer 100. This is followed by the deposition of a layer of phosphorous doped oxide 132 (known as vapox, "VOM" in FIG. 4). Vapox layer 132 is approximately 1 to 1.5 microns thick and is doped to have a phosphorous concentration of 2.5%. A pad mask (not shown) is then used to selectively etch vapox layer 132, LTO layer 130, and field oxide layer 108 down to the surface of silicon layer 106. This etch process can be performed using either dry or wet etch methods in a Triode etcher using a $CHF_3$ based chemistry. The resulting structure is shown in FIG. 4. Metal contact 138 provides an electrical contact for the signal conditioning circuitry and was formed during the processing steps used to produce that circuitry.

A 0.1 to 0.2 micron thick layer of plasma enhanced (PE) nitride 136 is then deposited over the top surface of SOI wafer 100. A pad mask (not shown) is used to selectively etch PE nitride layer 136 and vapox layer 132 to expose contact region 138. A dry/wet etch process using a LAM 384T Triode etcher and a BHF based chemistry may be used for this purpose (a LAM 590 diode etcher may also be used for this purpose). Note that a layer of PE nitride now conforms to the sidewalls of trenches 134. The resulting structure is shown in FIG. 5.

Next, a layer of photoresist 140 is applied on top of PE nitride layer 136, thereby covering the top surface of SOI wafer 100. Photoresist layer 140 is patterned using photolithography techniques to define the location for the movable element(s) (element 142 of FIG. 6) of the acceleration (or deceleration) sensor. A dry/wet etch process using a LAM 384T Triode etcher and a BHF based chemistry is used to etch PE nitride layer 136, vapox layer 132, LTO layer 130, and to partially etch field oxide layer 108, thereby exposing the top of the polysilicon 122 filling trenches 120 adjacent to the defined region.

The resulting structure is shown in FIG. 6. Note that the structure now has a central silicon region 142, surrounded on the bottom by buried oxide layer 104, on the top by field oxide layer 108, and on the sides by the sidewall oxide grown in polysilicon filled trenches 120. The structure of FIG. 6 will be subjected to further processing to form silicon region 142 into the acceleration (or deceleration) sensor for the device.

The structure of FIG. 6 is then subjected to a timed, isotropic etch process designed to remove the polysilicon 122 filling the trenches 120 on each side of central silicon region 142. The etch is performed in a Triode etcher using a $Cl_2$ based chemistry. The etch may also be performed using a microwave or RF source isotropic etch process. The etch should be very selective to oxide and serve to remove the polysilicon 122 in the etched region. The resulting structure is shown in FIG. 7.

Photoresist layer 140 is then used as a mask for performing a wet etch of the oxide surrounding central silicon region 142. A BHF based chemistry may be used for this etch. The polysilicon filling trenches 121 (see FIG. 2) acts as an etch stop to prevent lateral etching. The etch process serves to release central silicon region 142 from the rest of the accelerometer structure. The resulting structure is shown in FIG. 8.

Figure 9:
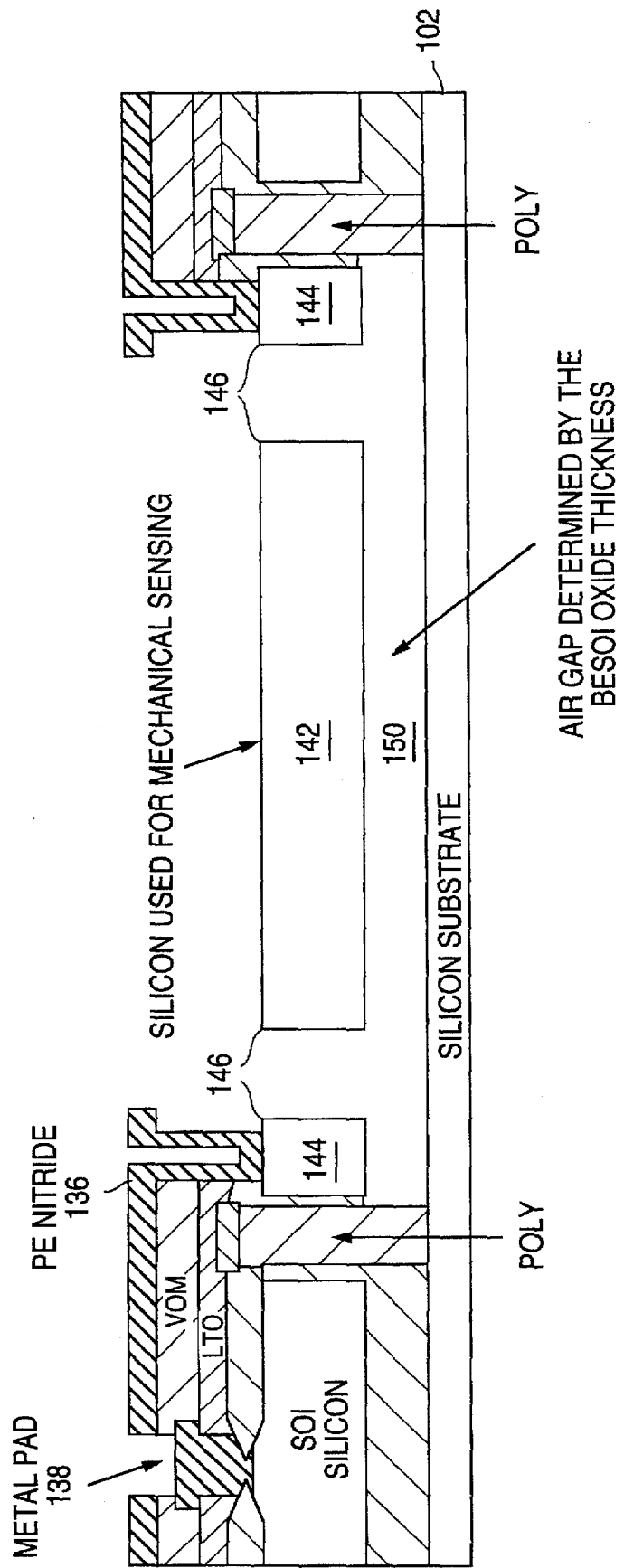

FIG. 9 shows the final cross-section of the acceleration (or deceleration) sensor of the present invention. As shown in the figure, central silicon region 142 is suspended above substrate 102, thereby making the region capable of motion relative to the substrate in response to an applied acceleration or deceleration. Region 142 is connected at the backside to anchors (not shown) formed during the fabrication process which allow it to be suspended as shown in the figure. Region 142 forms the movable electrode for a pair of two-plate capacitors 146 having fixed electrodes 144. As is well known, the capacitance of a parallel plate capacitor is inversely proportional to the separation between the electrodes. When substrate 102 is subjected to an acceleration or deceleration, silicon region 142 moves relative to electrodes 144, causing an increase in the electrode separation of one of capacitors 146, and a decrease in the electrode separation of the other of capacitors 146. The change in the differential capacitance of capacitors 146 is proportional to the acceleration or deceleration applied to substrate 102. Note that the air gap between electrodes 144 and silicon region 142 is determined by the width of the trenches (element 120 of FIG. 2) etched into the accelerometer structure. It is noted that the trench etch mask used can produce trenches as small as 0.5 microns in width. The ability to determine the air gap of the capacitors allows the responsivity of the device (the change in differential capacitance as a function of an applied acceleration) to be varied by adjusting the trench width. Similarly, the thickness of air gap 150 between silicon region 142 and substrate 102 depends on the thickness of the buried oxide layer of the original SOI wafer, and thus may be varied as desired.

Figure 10:
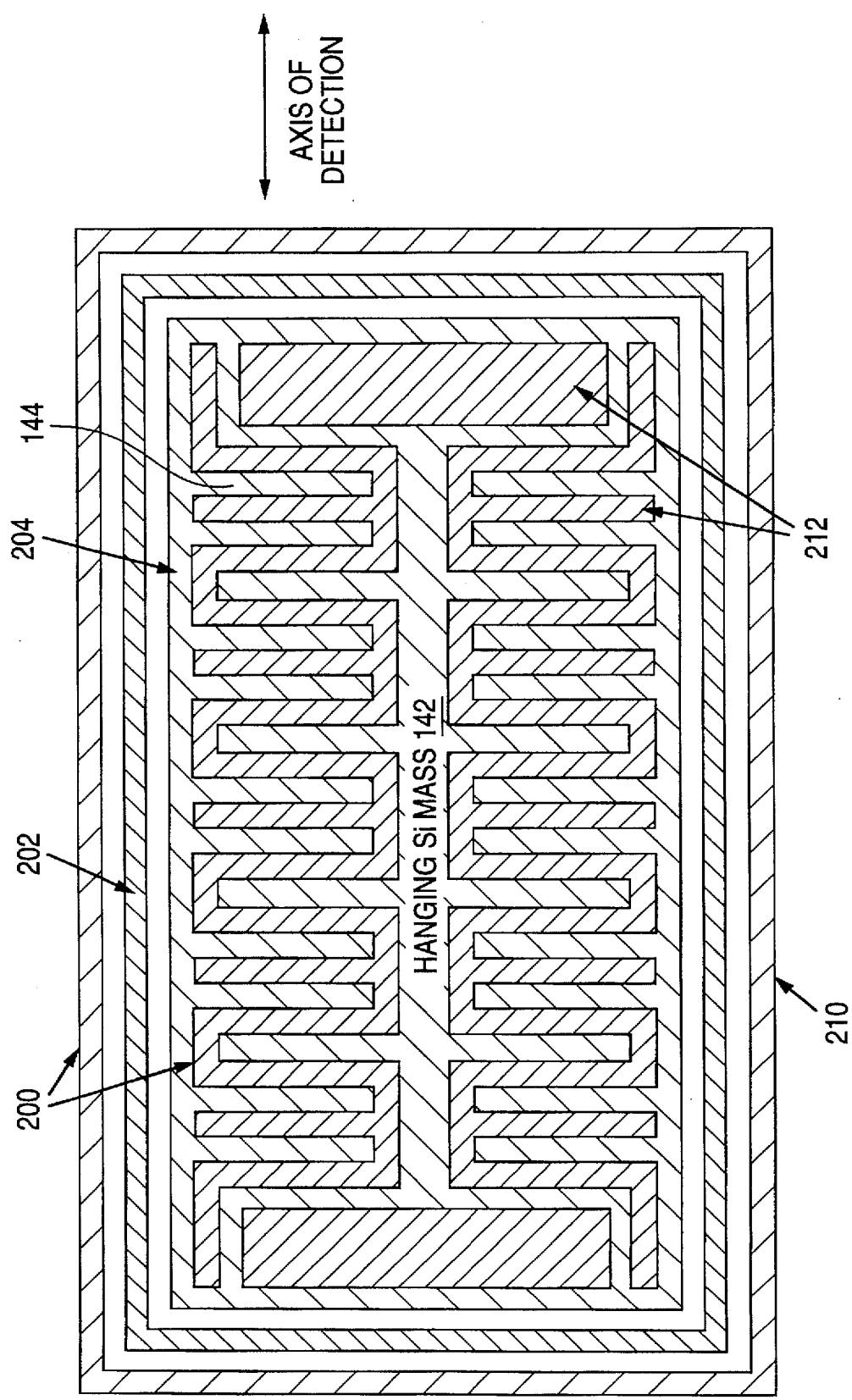
FIG. 10 is a top view of a layout for an accelerometer sensor fabricated according to the method of the present invention.

FIG. 10 is a top view of a layout for an accelerometer (or deceleration) sensor fabricated according to the method of the present invention. The axis of detection for the sensor is indicated. The "hanging" silicon mass 142 (see FIG. 9) forms the movable electrode for a set of differential capacitor pairs which are connected in parallel. Silicon mass 142 is anchored to SOI wafer 100 by means of silicon posts formed during the fabrication process. As shown in the figure, fixed electrodes 144 are interspersed between the electrode(s) formed from silicon mass 142. The sensor of FIG. 10 is suited for the sensing of lateral accelerations applied to SOI wafer 100 along the indicated axis.

Figure 11:
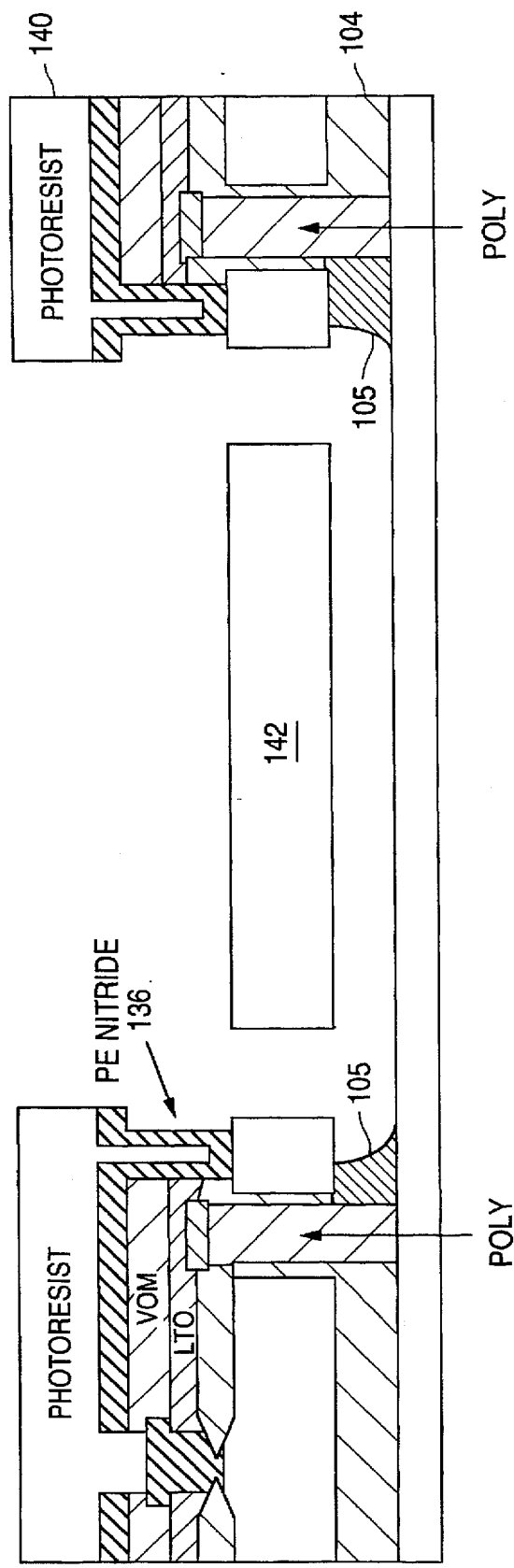
FIG. 11 is a side-cross-sectional view showing how an anchor for the sensor mass can be formed from a portion of the buried oxide layer.

The anchors used to support silicon mass 142 may be formed by several methods. In the structure of FIGS. 9 and 10, electrode 144 (which as shown in FIG. 10, provides part of the support for mass 142), is supported by PE nitride layer 136 and the sidewall oxide in the adjacent trench (element 121 of FIG. 2). The process flow which produced this structure may be modified in the case where silicon mass 142 is of sufficient width. In such a case, the wet etch step used to remove the oxide surrounding silicon mass 142 can be modified to leave a portion of buried oxide layer 104 (labelled element 105 in FIG. 11) underneath electrode 144 and in contact with the polysilicon filling trenches 121. This provides an additional anchor structure for that electrode. FIG. 11 is a side-cross-sectional view showing how an anchor for sensor mass 142 can be formed from a portion 105 of buried oxide layer 104.

Figure 12:
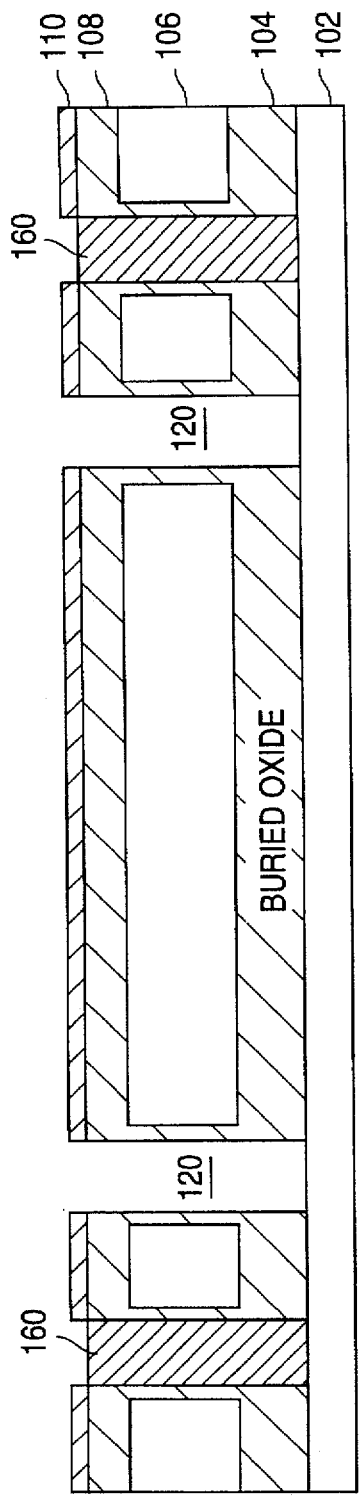
FIG. 12 is a side cross-sectional view showing how an anchor for the sensor mass can be formed by filling the anchor trenches with polysilicon.

Another method of forming the anchors involves additional processing of the structure of FIG. 2. In this case, a mask is used to wet etch the sidewall oxide, thereby removing it from the sidewalls and bottom of trenches 121 which are adjacent to the region used to form electrode 144. The subsequent filling of the trenches with polysilicon will cause the polysilicon to come into contact with substrate 102 and silicon layer 106. This not only provides an anchor for electrode 144, but also serves as an etch stop for the later wet etch which removes portions of buried oxide layer 104. FIG. 12 is a side cross-sectional view showing how an anchor for the sensor mass can be formed by filling anchor trenches 121 with polysilicon 160 after removal of the sidewall oxide from the anchor trenches.

Figure 13:
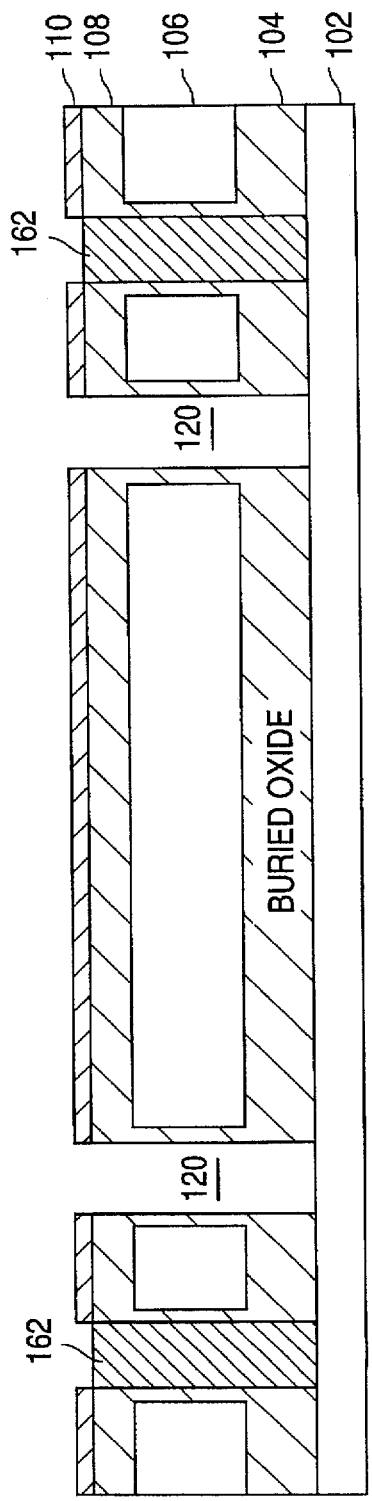
FIG. 13 is a side cross-sectional view showing how an anchor for the sensor mass can be formed by filling the anchor trenches with epitaxial silicon.

Finally, another method of forming the anchors is to wet etch the sidewall oxide to remove it form both the sidewalls and bottom of trenches 121 which are adjacent to the region used to form electrode 144. Next, a selective epitaxial silicon (SEG) growth process is used to fill the trenches with epitaxial silicon. This provides a single crystal silicon anchor to substrate 102. FIG. 13 is a side cross-sectional view showing how an anchor for the sensor mass can be formed by filling anchor trenches 121 with epitaxial silicon 162 after removal of the sidewall oxide from the anchor trenches.

Returning now to the discussion of FIG. 10, it is noted that this figure also shows the mask patterns used during the fabrication of the sensor. Mask 200 defines the pattern used for the etching of trenches 120 of FIG. 2. Mask 202 is the pad mask used to define the pattern for the vapox, LTO, and field oxide etch step described with reference to FIG. 4. Mask 204 is the sensor mask used to define the sensor pattern, which includes the movable and fixed electrode members, and was described with reference to FIG. 6. It is noted that during the fabrication process described herein, the trenches indicated by element 210 will be filled with polysilicon down to substrate 102 of SOI wafer 100. In contrast, the trenches indicated by element 212 will have the polysilicon removed by an etch and then will be used to wet etch the underlying oxide layer, thereby forming silicon mass 142.

Figure 14:
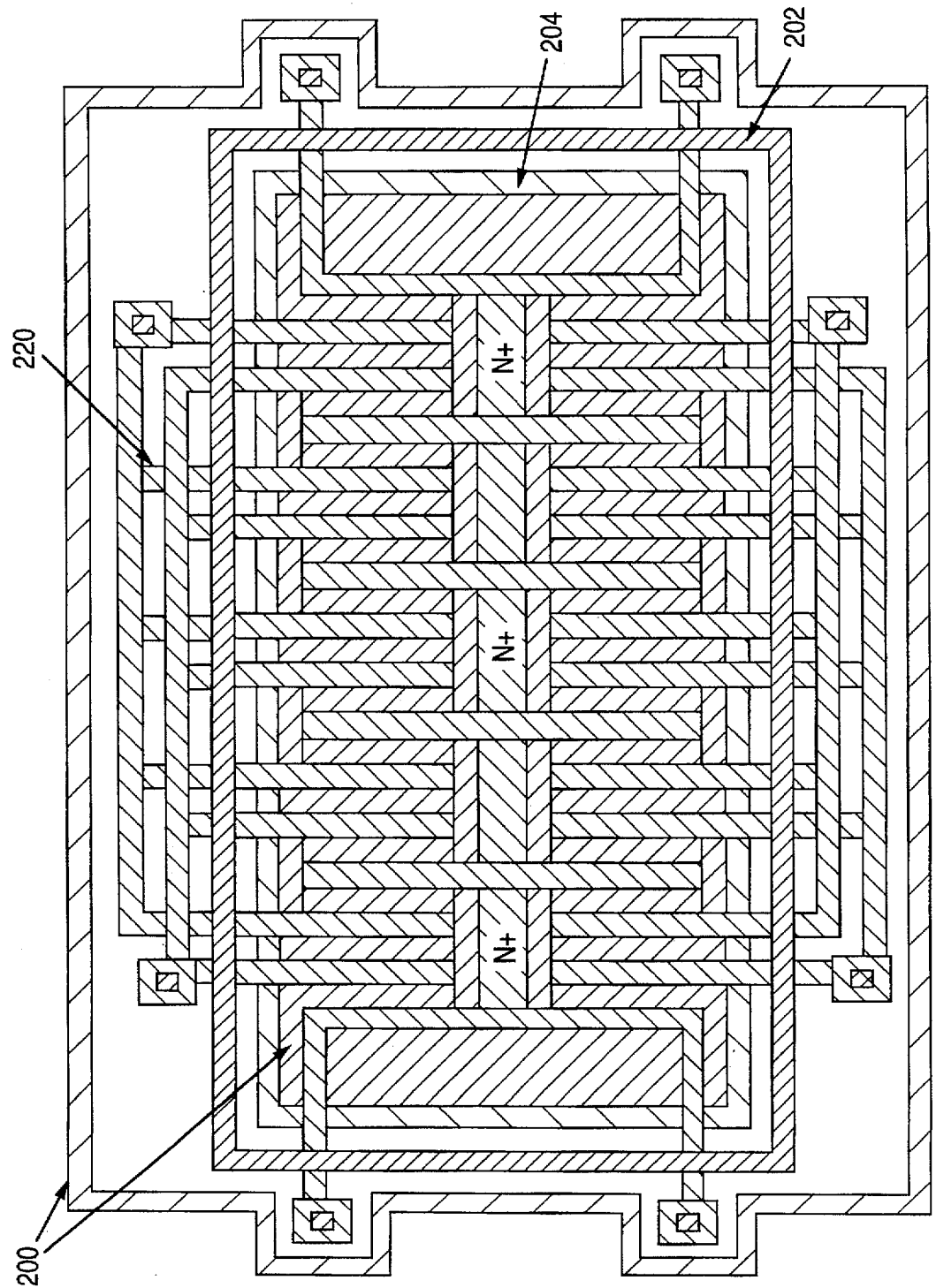
FIG. 14 is a top view of a layout for the contacts of the accelerometer sensor of FIG. 10.

FIG. 14 is a top view of a layout for the contacts 220 of the accelerometer sensor of FIG. 10. As in FIG. 10, trench mask 200, pad mask 202, and sensor mask 204 are indicated. A separate contact is needed for each plate of the capacitors formed during the process, and a third contact for a ground connection. The previously formed sinker and buried layer regions (with appropriate junction isolation in between the two) can be used for contacts to the capacitor plates, while the top of the polysilicon layer may be used for the ground contact.

Figure 15:
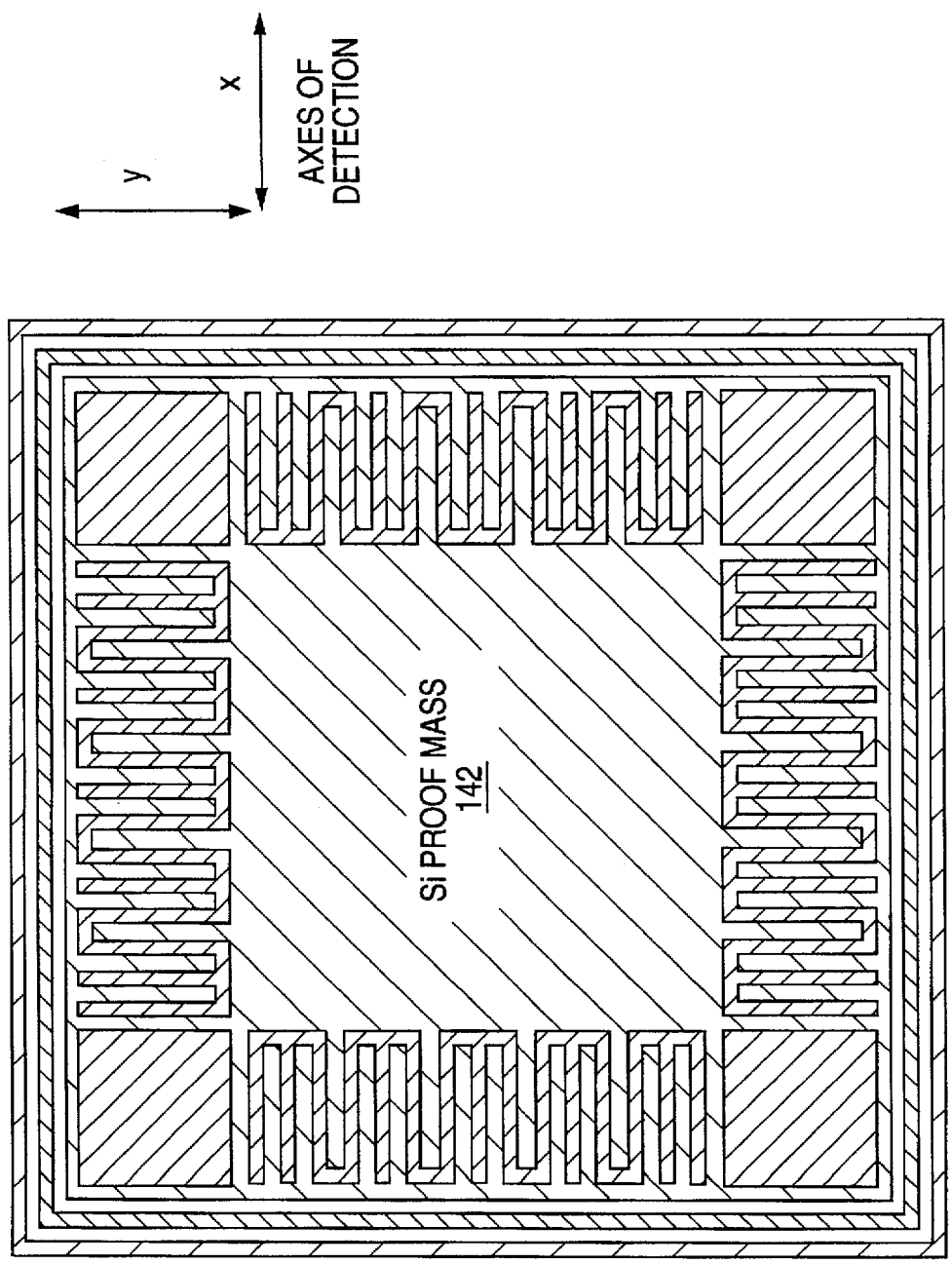
FIG. 15 is a top view of a layout for a second embodiment of an accelerometer sensor fabricated according to the method of the present invention.

FIG. 15 is a top view of a layout for a second embodiment of an accelerometer (or deceleration) sensor fabricated according to the method of the present invention.. The axes of detection for the sensor are indicated. The sensor embodiment shown in FIG. 12 may be used to detect lateral accelerations (forces) applied in either the x or y direction. It may also be used to detect accelerations in the z direction if the substrate is used as a terminal. When used to sense accelerations in the z direction, the sensor functions as a parallel plate capacitor sensor instead of a pair of capacitors which sense differential capacitance.

The method of manufacturing an accelerometer using SOI wafers which has been described has several benefits over other currently used methods. The present invention uses a process flow compatible with SOI wafer structures to produce an improved sensor design and associated signal conditioning on the same wafer. The sensor is made from single crystal silicon and thus is more reliable and less subject to stress than sensors made from polysilicon. The sensitivity of the sensor will be better than for a sensor made from polysilicon because the thickness of the single crystal silicon layer can be larger than for a polysilicon sensor. This means that the active area between the capacitor plates (electrodes) is increased, producing a larger capacitance change for the same applied force. A thicker sensor will also reduce stray capacitance relative to a polysilicon sensor when used for sensing of lateral acceleration.

The signal conditioning circuitry possesses the benefits of SOI isolation, such as reduced capacitive coupling between circuit elements, reduced chip size, and increased speed. The result is a process flow which is compatible with current integrated circuit processing methods and produces an improved acceleration (or deceleration) sensor and associated circuitry.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method of making a monolithic accelerometer which includes a sensor and associated signal conditioning circuitry, comprising:

preparing a silicon-on-insulator (SOI) wafer, wherein the SOI wafer includes a substrate wafer, a silicon layer, and an oxide layer positioned in between the substrate wafer and the silicon layer;

forming a buried layer for use in fabricating the signal conditioning circuitry in the silicon layer of the SOI wafer;

defining a location for the sensor on the silicon layer of the SOI wafer;

defining a location for a sensor trench in the silicon layer on each side of the defined sensor location;

etching the sensor trenches on each side of the sensor location down to the oxide layer of the SOI wafer;

filling the sensor trenches with polysilicon;

processing the SOI wafer to form the signal conditioning circuitry;

etching the polysilicon in the sensor trenches down to the substrate wafer; and etching the oxide layer surrounding the silicon layer in the defined sensor location.

2. The method of claim 1, wherein the SOI wafer is prepared using a wafer bonding process.

3. The method of claim 1, wherein the SOI wafer is prepared using a SIMOX process.

4. The method of claim 1, wherein the SOI wafer is prepared using a zone-melting recrystallization process.

5. The method of claim 1, wherein the SOI wafer is processed to form the signal conditioning circuitry using a bipolar process flow.

6. The method of claim 1, wherein the SOI wafer is processed to form the signal conditioning circuitry using a BiCMOS process flow.

7. The method of claim 1, wherein the SOI wafer is processed to form the signal conditioning circuitry using a CMOS process flow.

8. The method of claim 1, further comprising the steps of:

defining a location for an electrode on each side of the sensor trenches and opposite the sensor location;

defining a location for an anchor trench on each side of the defined electrode locations and opposite the sensor trenches; and etching the anchor trenches down to the oxide layer of the SOI wafer.

9. The method of claim 8, further comprising the step of:

filling the anchor trenches with polysilicon, thereby forming an anchor structure for the electrodes.

10. The method of claim 8, further comprising the step of:

filling the anchor trenches with epitaxial silicon, thereby forming an anchor structure for the electrodes.

* * * * *